(12) United States Patent
Wei et al.

(10) Patent No.: US 12,314,197 B2
(45) Date of Patent: May 27, 2025

(54) FIFO MEMORY SYSTEM AND FIFO MEMORY CONTROL METHOD

(71) Applicants: Beijing BOE Technology Development Co., Ltd., Beijing (CN); BOE Technology Group Co., Ltd., Beijing (CN)

(72) Inventors: Xiangye Wei, Beijing (CN); Liming Xiu, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/271,865

(22) PCT Filed: Jul. 1, 2022

(86) PCT No.: PCT/CN2022/103351
§ 371 (c)(1),
(2) Date: Jul. 12, 2023

(87) PCT Pub. No.: WO2023/005599
PCT Pub. Date: Feb. 2, 2023

(65) Prior Publication Data
US 2024/0078201 A1    Mar. 7, 2024

(30) Foreign Application Priority Data

Jul. 30, 2021  (CN) .......................... 202110875163.4

(51) Int. Cl.
*G06F 13/16*    (2006.01)
*G06F 5/10*    (2006.01)

(52) U.S. Cl.
CPC ............ *G06F 13/1689* (2013.01); *G06F 5/10* (2013.01); *G06F 13/1621* (2013.01)

(58) Field of Classification Search
CPC .... G06F 13/1689; G06F 5/10; G06F 13/1621; G06F 1/08; G06F 5/06; G06F 11/14; G11C 7/22
See application file for complete search history.

(56) References Cited

U.S. PATENT DOCUMENTS 5,602,812 A * 2/1997 Miura .................... G11B 19/28
6,061,315 A     5/2000 Inagawa et al.
(Continued)

FOREIGN PATENT DOCUMENTS

CN    1111786 A    11/1995
CN    1177243 A    3/1998

*Primary Examiner* — Tasnima Matin
(74) *Attorney, Agent, or Firm* — IPro, PLLC

(57) ABSTRACT

Provide is a FIFO memory system. The FIFO memory system includes: a FIFO memory; a read clock frequency circuit, configured to provide at least two clock signals, wherein the at least two clock signals include a first clock signal and a second clock signal, a frequency of the first clock signal being greater than a frequency of the second clock signal; and a controller, configured to determine a data volume in the FIFO memory, control the read clock frequency circuit to output the first clock signal in a case that the data volume in the FIFO memory is in a first range, or control the read clock frequency circuit to output the second clock signal in a case that the data volume in the FIFO memory is in a second range, the lower limit of the first range being not less than an upper limit of the second range.

17 Claims, 6 Drawing Sheets

(56) References Cited

U.S. PATENT DOCUMENTS

| | | | |
|---|---|---|---|
| 6,347,380 B1 | 2/2002 | Chang et al. | |
| 12,147,262 B2* | 11/2024 | Foo | G06F 12/023 |
| 2014/0310549 A1* | 10/2014 | Herbeck | G06F 1/3225 |
| | | | 713/322 |
| 2016/0202722 A1* | 7/2016 | Kuwata | H04J 14/00 |
| | | | 713/501 |
| 2016/0226655 A1* | 8/2016 | Mu | G06F 5/06 |
| 2018/0013505 A1* | 1/2018 | Atsumi | H04J 3/167 |
| 2018/0088622 A1* | 3/2018 | Leong | G06F 1/08 |
| 2020/0409408 A1* | 12/2020 | Nair | G06F 1/12 |

\* cited by examiner

FIFO MEMORY SYSTEM AND FIFO MEMORY CONTROL METHOD

CROSS-REFERENCE TO RELATED APPLICATION

This application is a U.S. national stage of international application No. PCT/CN2022/103351, filed on Jul. 1, 2022, which claims priority to Chinese Patent Application No. 202110875163.4, filed on Jul. 30, 2021 and entitled "FIFO MEMORY SYSTEM AND FIFO MEMORY CONTROL METHOD," the disclosures of which are herein incorporated by reference in their entireties.

TECHNICAL FIELD

The present disclosure relates to a FIFO memory system and a FIFO memory control method.

BACKGROUND

A first-in, first-out (FIFO) memory is an important structure in a System on Chip (SoC). The FIFO memory is generally configured to transmit data between different clock domains, wherein different clock domains refer to that a frequency of a write clock of the FIFO memory is different from a frequency of a read clock of the FIFO memory. For example, the frequency of the write clock of the FIFO memory is 50 MHz, and the frequency of the read clock of the FIFO memory is 40 MHz.

SUMMARY

Embodiments of the present disclosure provide a FIFO memory system and a FIFO memory control method.

At least one of the embodiments of the present disclosure provides a FIFO memory system. The FIFO memory system includes: a FIFO memory; a read clock frequency circuit, configured to provide at least two clock signals, wherein the at least two clock signals include a first clock signal and a second clock signal, a frequency of the first clock signal being greater than a frequency of the second clock signal; and a controller, configured to determine a data volume in the FIFO memory, control the read clock frequency circuit to output the first clock signal in the case that the data volume in the FIFO memory is in a first range, or control the read clock frequency circuit to output the second clock signal in a case that the data volume in the FIFO memory is in a second range; wherein a lower limit of the first range is not less than an upper limit of the second range.

In some embodiments, the lower limit of the first range is a first threshold, an upper limit of the first range is a capacity of the FIFO memory, a lower limit of the second range is 0, and the upper limit of the second range is a second threshold, the first threshold being greater than the second threshold; and the controller is further configured to control the clock signal output by the read clock frequency circuit to remain unchanged in the case that the data volume in the FIFO memory is in a third range, wherein a lower limit of the third range is the second threshold, and an upper limit of the third range is the first threshold.

In some embodiments, a ratio of a difference between the first threshold and the second threshold to the capacity of the FIFO memory is not less than 5% and not more than 25%.

In some embodiments, the frequency of the first clock signal is greater than a frequency of a write clock of the FIFO memory, and the frequency of the second clock signal is less than the frequency of the write clock of the FIFO memory.

In some embodiments, the controller is configured to generate a control word based on the data volume in the FIFO memory; and the read clock frequency circuit is configured to output the first clock signal or the second clock signal based on the control word; wherein the first clock signal and the second clock signal both include a first frequency signal and a second frequency signal, probabilities of occurrence of the first frequency signal and the second frequency signal being controlled by the control word.

In some embodiments, the controller is configured to, in a case that the data volume in the FIFO memory is in the second range and a valid signal of the FIFO memory is at a low level, make the frequency of the second clock signal decrease according to a first law by controlling the generated control word to vary.

In some embodiments, the read clock frequency circuit includes: a frequency synthesizer, configured to generate a pulse signal based on reference pulse signals and the control word, the reference pulse signals being uniformly spaced in phase, the pulse signal being the first clock signal or the second clock signal; wherein the control word includes a first coefficient and a second coefficient; and the pulse signal includes the first frequency signal generated based on the reference pulse signals and the first coefficient, and the second frequency signal generated based on the reference pulse signals and the first coefficient, a proportion of the first frequency signal and the second frequency signal in the pulse signal being controlled by the second coefficient.

In some embodiments, the controller is configured to determine the data volume in the FIFO memory based on a flag bit output by the FIFO memory.

At least one of the embodiments of the present disclosure provides a FIFO memory control method. The method includes: determining a data volume in a FIFO memory; and controlling a read clock frequency circuit to output a first clock signal as a read clock of the FIFO memory in a case that the data volume in the FIFO memory is in a first range, or controlling the read clock frequency circuit to output a second clock signal as the read clock of the FIFO memory in a case that the data volume in the FIFO memory is in a second range; wherein a lower limit of the first range is not less than an upper limit of the second range.

In some embodiments, the lower limit of the first range is a first threshold, an upper limit of the first range is a capacity of the FIFO memory, a lower limit of the second range is 0, and the upper limit of the second range is a second threshold, the first threshold being greater than the second threshold. The method further includes: controlling the read clock of the FIFO memory to remain unchanged, in a case that the data volume in the FIFO memory is in a third range, wherein a lower limit of the third range is the second threshold, and an upper limit of the third range is the first threshold.

In some embodiments, wherein controlling the read clock frequency circuit to output the first clock signal as the read clock of the FIFO memory in the case that the data volume in the FIFO memory is in the first range, or controlling the read clock frequency circuit to output the second clock signal as the read clock of the FIFO memory in the case that the data volume in the FIFO memory is in the second range includes: generating a control word based on the data volume in the FIFO memory; and making the read clock frequency circuit output the first clock signal or the second clock signal based on the control word by outputting the control word to the read clock frequency circuit, wherein the first clock signal and the second clock signal both include a first frequency signal and a second frequency signal, probabilities of occurrence of the first frequency signal and the second frequency signal being controlled by the control word.

In some embodiments, wherein generating the control word based on the data volume in the FIFO memory includes: in a case that the data volume in the FIFO memory is in a second range and a valid signal of the FIFO memory is at a low level, making a frequency of the second clock signal decrease according to a first law by controlling the generated control word to vary.

In some embodiments, wherein determining the data volume in the FIFO memory includes: determining the data volume in the FIFO memory based on a flag bit output by the FIFO memory.

DETAILED DESCRIPTION

For clearer description of principles and advantages of the present disclosure, the embodiments of the present disclosure are further described in detail hereinafter with reference to the accompanying drawings.

A capacity of the FIFO memory is related to the frequency of the write clock, the frequency of the read clock and a length of data written each time. In a case that the length of data written each time is large, if the frequency of the write clock is greater than the frequency of the read clock, for avoiding that the FIFO memory is quickly written to be full, the capacity of the FIFO memory needs to be designed to be high, such that occupied area is large; and on the other hand, if the writing of data in the FIFO memory is suspended, a situation that the data in the FIFO memory is completely read out is easy to occur, and as the frequency of the read clock is less than the frequency of the write clock, the situation that the FIFO memory is completely full for writing can also occur, thereby resulting in difficulties in ensuring continuity of the data.

Figure 1:
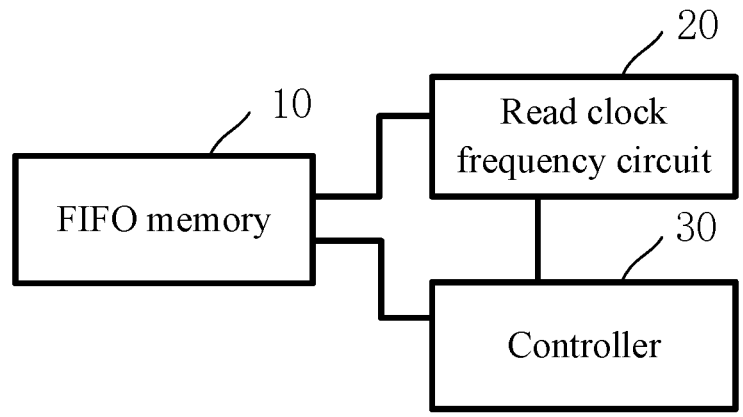
FIG. 1 is a schematic diagram of a structure of a FIFO memory system according to some embodiments of the present disclosure.

FIG. 1 is a schematic diagram of a structure of a FIFO memory system according to some embodiments of the present disclosure. Referring to FIG. 1, the FIFO memory system includes: a FIFO memory 10, a read clock frequency circuit 20, and a controller 30. The read clock frequency circuit 20 is connected to the FIFO memory 10 and to the controller 30, and the controller 30 is further connected to the FIFO memory 10.

The read clock frequency circuit 20 is configured to provide at least two clock signals, wherein the at least two clock signals include a first clock signal and a second clock signal, a frequency of the first clock signal is greater than a frequency of the second clock signal.

The controller 30 is configured to determine a data volume in the FIFO memory, control the read clock frequency circuit to output a first clock signal in a case that the data volume in the FIFO memory is in a first range, or control the read clock frequency circuit to output a second clock signal in a case that the data volume in the FIFO memory is in a second range, wherein a lower limit of the first range is not less than an upper limit of the second range.

The control of the read clock frequency of the FIFO memory is achieved by using the above system in the embodiments of the present disclosure. In the case that the data volume in the FIFO memory is large, the first clock signal with a high frequency is taken as a read clock of the FIFO memory, such that the data in the FIFO memory are capable of being read out quickly, thereby reducing the data volume of the FIFO memory, and a situation that the FIFO memory is full for writing is avoided. In the case that the data volume in the FIFO memory is small, the second clock signal with a low frequency is taken as the read clock of the FIFO memory, such that the data in the FIFO memory is prevented from being read out too fast to cause interruption of data reading, thereby ensuring the continuity of reading data. In addition, the FIFO memory is controlled not to be full for writing by using the system in the embodiments, such that a FIFO memory with small capacity is used, and an area and a power of the FIFO memory are saved.

The continuity of data is very important for some systems, such as Universal Serial Bus (USB) sound box, which reads data in the FIFO memory for music playing, and in a case that the data are discontinuous, the playing is interrupted and noise is generated. In addition, a smooth data reading out speed is required by the continuity of data, such that the playing effect of the USB sound box is ensured.

In a possible implementation, the first range and the second range are two continuous ranges, that is, the lower limit of the first range is the same as the upper limit of the second range. An upper limit of the first range is a capacity of the FIFO memory, and a lower limit of the second range is 0.

In another possible implementation, the first range and the second range are two discontinuous ranges.

For example, the lower limit of the first range is a first threshold, the upper limit of the first range is the capacity of the FIFO memory, the lower limit of the second range is 0, and the upper limit of the second range is a second threshold, wherein the first threshold is greater than the second threshold. Between the first range and the second range, a third range is present, wherein a lower limit of the third range is the second threshold and an upper limit of the third range is the first threshold.

It should be noted that as endpoints of the first, second and third ranges are overlapped, for example, the upper limit of the third range is the first threshold, and the lower limit of the first range is the first threshold, in which case one of the first range and the third range includes the endpoint value (the first threshold), and the other does not. For example, the first range is (first threshold, capacity of the FIFO memory], the second range is [0, second threshold), and the third range is [second threshold, first threshold].

The controller 30 is further configured to control the clock signal output by the read clock frequency circuit to remain unchanged in a case that the data volume in the FIFO memory is in the third range.

In the embodiments of the present disclosure, the controller 30 periodically determines the data volume in the FIFO memory and controls the clock signal output by the read clock frequency circuit. In a case that the data volume in the FIFO memory in the current cycle is in the third range, the clock signal output by the read clock frequency circuit is controlled to remain unchanged compared to the previous cycle.

For example, in the present cycle, the data volume in the FIFO memory is in the third range. In a case that a clock signal output by the read clock frequency circuit controlled by the controller 30 in the previous cycle is the first clock signal, the read clock frequency circuit is controlled to output the first clock signal in the present cycle. In a case that the clock signal outputted by the read clock frequency circuit controlled by the controller 30 in the previous cycle is the second clock signal, the read clock frequency circuit is controlled to output the second clock signal in the present cycle.

In the embodiments of the present disclosure, the first threshold and the second threshold are designed in relation to that the controller controls the read clock frequency circuit to change the frequency of the output clock signal. For example, the smaller a difference between the first threshold and the second threshold, the more easily the data volume in the FIFO memory varies between the first range and the second range, and accordingly, the higher the frequency at which the controller controls the read clock frequency circuit to change the output clock signal, the higher the accuracy of the control. Conversely, the greater the difference between the first threshold and the second threshold, the less easily the data volume in the FIFO memory varies between the first range and the second range, and accordingly, the lower the frequency at which the controller controls the read clock frequency circuit to change the output clock signal, the lower the hardware requirements on the controller and the lower the power consumption required by the controller.

In some embodiments, a ratio of the difference between the first threshold and the second threshold to the capacity of the FIFO memory is not less than 5% and not more than 25%.

For example, the capacity of the FIFO memory is 200, the first threshold is 100, and the second threshold is 50. For another example, the capacity of the FIFO memory is 200, the first threshold is 60, and the second threshold is 50.

In the embodiments of the present disclosure, the first threshold cannot be set too large, for example, the first threshold cannot be greater than 75% of the capacity of the FIFO memory. The second threshold cannot be set too small, for example, the second threshold cannot be less than 25% of the capacity of the FIFO memory. Therefore, enough space is reserved in the first range and the second range, the situation that the maximum capacity of the FIFO is easily reached after the data volume in the FIFO memory reaches the first range is avoided, or the situation that the data volume in the FIFO memory is easily read out after the data volume in the FIFO memory reaches the second range is avoided.

In the embodiments of the present disclosure, the capacity of the FIFO memory is generally designed to be small, for example, the capacity of the FIFO memory is several hundred or one thousand. The capacity of the FIFO memory is independent of a length of data written each time (that is, the capacity of the FIFO memory is decoupled from the length of data written each time), and the FIFO memory is simpler in design and is more robust. The unit of the data volume or capacity referred to in the present disclosure is several bits or bytes, for example, each unit is 32 or 64 bits. For example, the capacity of the FIFO memory referred to in the present disclosure is 200, that is, the capacity of the FIFO memory is 200×32 bits.

In the related art, the capacity of the FIFO memory (FIFO SIZE) is related to the frequency of the write clock ($f_w$), the frequency of the read clock ($f_r$), and the length of data written each time ($length_{data\_i}$), for example, the length of data written at one time is 100000, the frequency of the write clock is 50 MHz, and the frequency of the read clock is 40 MHz, and then the capacity of the FIFO memory is calculated as follows:

$$FIFO\ SIZE = Length_{data\_i}\frac{f_w - f_r}{f_w} = 100000\frac{50\_40}{50} = 20000.$$

In the embodiments of the present disclosure, part of the numerical values in the above example are also taken as examples, that is, the length of the data written at one time is 100000, the frequency of the write clock is 50 MHz, the frequency of the read clock varies with the switching of the first clock signal and the second clock signal, and by controlling the frequency of the read clock, the capacity of the FIFO memory is designed to be 200.

In some embodiments, the frequency of the write clock is taken as a reference for switching the frequency of the read clock. For example, the frequency of the first clock signal is greater than the frequency of the write clock of the FIFO memory, and the frequency of the second clock signal is less than the frequency of the write clock of the FIFO memory. Then, in the case that the first clock signal is taken as the read clock, read frequency of the FIFO memory is higher than a write frequency of the FIFO memory, such that the data in the FIFO memory continuously decreases. In the case that the second clock signal is taken as the read clock, the write frequency of the FIFO memory is higher than the read frequency of the FIFO memory, such that the data in the FIFO memory continuously increases.

The solution provided by the present disclosure is described below with reference to FIG. 2 and FIG. 3 by taking the frequency of the write clock as 50 MHz as an example.

Figure 2:
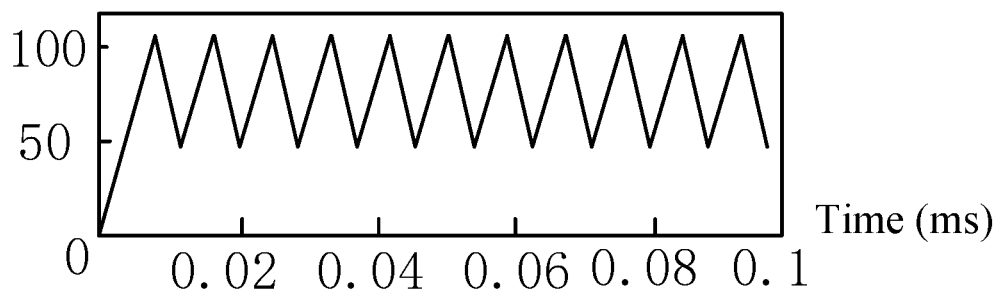
FIG. 2 is a schematic diagram of a variation of a data volume in a FIFO memory according to some embodiments of the present disclosure.
Figure 3:
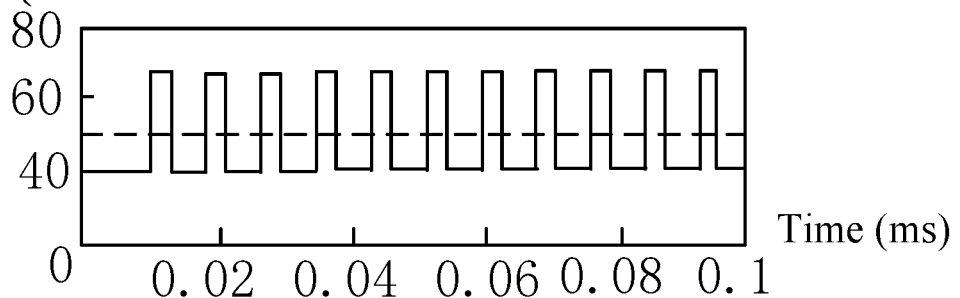
FIG. 3 is a schematic diagram of a frequency variation of a read clock of a FIFO memory according to some embodiments of the present disclosure.

FIG. 2 is a schematic diagram of a variation of a data volume in a FIFO memory according to the above example. FIG. 3 is a schematic diagram of a frequency variation of a read clock of a FIFO memory according to the above example. As seen from the combination of FIG. 2 and FIG. 3, in the case that the data volume in the FIFO memory is greater than 100, $f_r$ is switched to 66.7 MHz (greater than the 50 MHz frequency of the write clock, dashed line in FIG. 3); and in the case that the data volume in the FIFO memory is less than 50, $f_r$ is switched to 40 MHz (less than the 50 MHz frequency of the write clock). This kind of control causes the data volume in the FIFO memory to vary from 50 to 100 most of the time.

In a possible implementation of the present disclosure, the controller 30 is configured to generate a control word based on the data volume in the FIFO memory.

The read clock frequency circuit 20 is configured to output the first clock signal or the second clock signal based on the control word; wherein the first clock signal and the second clock signal both include a first frequency signal and a second frequency signal, probabilities of occurrence of the first frequency signal and the second frequency signal being controlled by the control word.

In some embodiments, the controller 30 is configured to generate a first control word in a case that the data volume in the FIFO memory is in a first range, wherein the first control word is configured to cause the read clock frequency circuit to output the first clock signal, and the controller 30 is further configured to generate a second control word in a case that the data volume in the FIFO memory is in a second range, wherein the second control word is configured to cause the read clock frequency circuit to output the second clock signal.

In some embodiments, the controller 30 is configured to determine the data volume in the FIFO memory based on a flag bit output by the FIFO memory.

In some embodiments, the controller (Control Block) is implemented by using a programmable chip or other chips.

Figure 4:
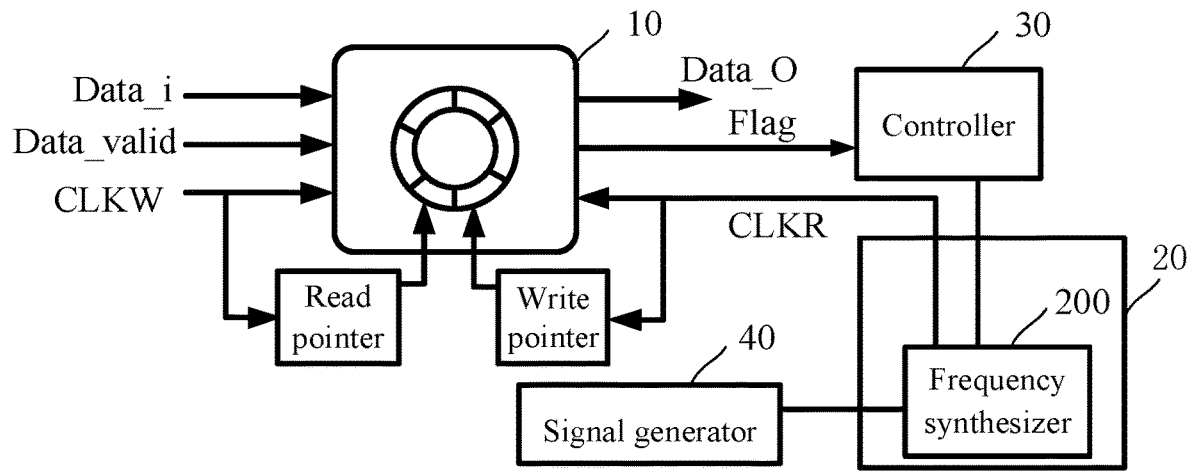
FIG. 4 is a detailed schematic diagram of a structure of a FIFO memory system according to some embodiments of the present disclosure.

FIG. 4 is a detailed schematic diagram of a structure of a FIFO memory system according to the embodiments of the present disclosure. Referring to FIG. 4, input data of the FIFO memory 10 is Data_i, output data of the FIFO memory is Data_o, a write clock of the FIFO memory is CLKW, a read clock of the FIFO memory is CLKR. The FIFO memory 10 is configured with a write pointer and a read pointer, wherein the write pointer is configured to count based on rising edges of the write clock CLKW, and the read pointer is configured to count based on rising edges of the read clock CLKR. Based on the write pointer and the read pointer, the FIFO memory 10 determines how much the data volume is in the FIFO memory and output the data volume to the controller 30 in the form of a flag bit.

The FIFO memory 10 is further controlled by a valid signal (Data_valid). For example, in a case that the valid signal is at a low level, the input data is invalid or suspended, and no data are written into the FIFO memory. However, as the reading of data is still in progress, the data in the FIFO memory is easily read out, thereby causing a data discontinuity problem. To avoid this situation, that is, to guarantee the continuity of data in the case that the valid signal is at the low level, the controller 30 is configured to make the frequency of the second clock signal decrease according to a first law by controlling the generated control word to vary, in the case that the data volume in the FIFO memory is in the second range and the valid signal of the FIFO memory is at the low level. That is, the second control word is variable in the embodiments of the present disclosure. The above control is achieved by the controller 30 acquiring the valid signal through the FIFO memory.

Decreasing according to the first law is referred to gradually decreasing with time, for example, linearly decreasing, or decreasing according to a smooth curve, or the like.

In the embodiments of the present disclosure, the size of the control word provided by the controller 30 is inversely proportional to the frequency of the second clock signal. That is, to control the frequency of the second clock signal to gradually decrease, the output control word needs to gradually increase.

Figure 5:
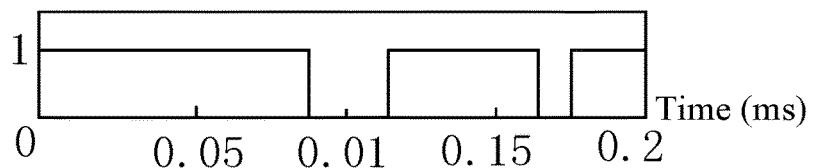
FIG. 5 is a schematic diagram of a waveform of a valid signal according to some embodiments of the present disclosure.
Figure 6:
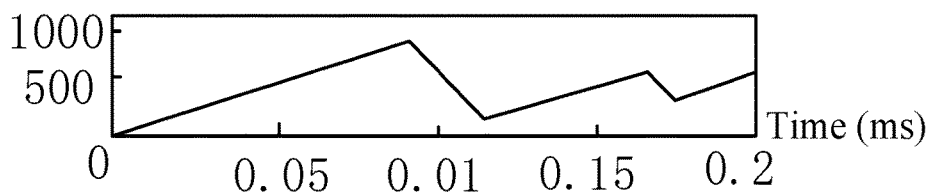
FIG. 6 is another schematic diagram of a variation of a data volume in a FIFO memory according to some embodiments of the present disclosure.
Figure 7:
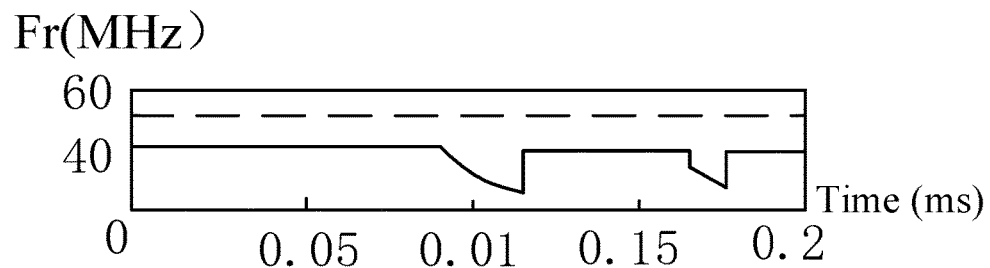
FIG. 7 is another schematic diagram of a frequency variation of a read clock of a FIFO memory according to some embodiments of the present disclosure.

The above embodiments are described hereinafter with reference to the accompanying drawings. FIG. 5 is a schematic diagram of a waveform diagram of a valid signal. FIG. 6 is another schematic diagram of a variation of a data volume in a FIFO memory. FIG. 7 is another schematic diagram of a frequency variation of a read clock of a FIFO memory. As seen from FIG. 5 to FIG. 7, because the valid signal is usually at the low level (0), written data volume is less, the data volume in the FIFO memory is always in the second range (0 to 1000 bits), and the clock signal output by the read clock frequency circuit 20 is the second clock signal. In a case that the valid signal is at a high level (1), the frequency of the second clock signal is maintained at 40 MHz, and in the case that the valid signal is at the low level (0), the frequency of the second clock signal is continuously decreased, such that in the case that the valid signal is at the low level, that is, in the case that no data are input into the FIFO memory, the data variation inside the FIFO memory is in a smooth transition, and the data volume is not decreased to 0. In this way, an output port always output data, thereby ensuring data continuity.

In other implementations, the frequency of the second clock signal remains unchanged at all times regardless of whether the active clock is at the high level or the low level.

Referring to FIG. 4, the read clock frequency circuit 20 includes a frequency synthesizer 200, the frequency synthesizer 200 being connected to the FIFO memory 10 and the controller 30.

The frequency synthesizer 200 is configured to generate a pulse signal based on reference pulse signals and the control word, wherein the reference pulse signals and the control word are uniformly spaced in phase, and the pulse signal is the first clock signal or the second clock signal.

The control word includes a first coefficient and a second coefficient.

The pulse signal includes the first frequency signal generated based on the reference pulse signals and the first coefficient, and the second frequency signal generated based on the reference pulse signals and the first coefficient, a proportion of the first frequency signal and the second frequency signal in the pulse signal being controlled by the second coefficient.

In some embodiments, a relationship of the first coefficient and the second coefficient is as follows: a sum of the first coefficient and the second coefficient is the control word, for example, the first coefficient is an integer part of the control word and the second coefficient is a fractional part of the control word.

Referring to FIG. 4, the FIFO memory system further includes a signal generator 40. The signal generator 40 is connected to the read clock frequency circuit 20, and the signal generator 40 is configured to generate reference pulse signals which are uniformly spaced in phase.

Figure 8:
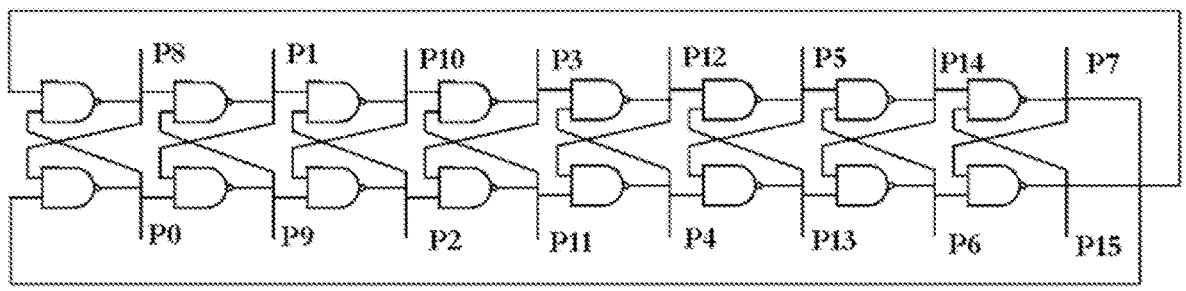
FIG. 8 is a schematic diagram of a structure of a ring oscillator in FIG. 4.

In some embodiments, the signal generator 40 is a ring oscillator (RO). FIG. 8 is a schematic diagram of a structure of a ring oscillator. Referring to FIG. 8, the ring oscillator includes a plurality of nand gates, wherein the nand gates are connected to form a ring. The ring oscillator is provided with a plurality of pins P0-P15, wherein one of the pins is taken as an input end to input a path of an initial pulse signal, the initial pulse signal passing through the nand gates to generate a delay, and the other pins are taken as output ends to output a plurality of paths of reference pulse signals, and the paths of reference pulse signals are reference pulse signals which are uniformly spaced in phase.

The reference pulse signals which are uniformly spaced in phase mean that the phase variation conditions of a plurality of paths of pulse signals generated by the signal generator 40 are the same, and space between initial phases of the paths of pulse signals are the same.

Figure 9:
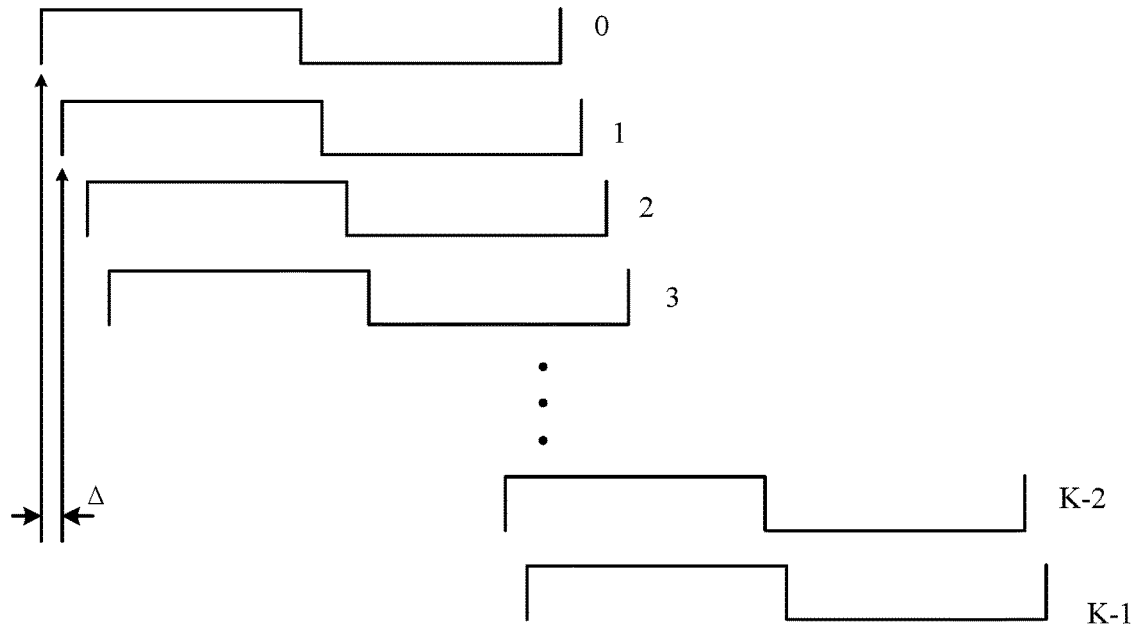
FIG. 9 is a waveform diagram of K paths of reference pulse signals, which are uniformly spaced in phase, generated by a signal generator in FIG. 4.

FIG. 9 is a waveform diagram of K paths of reference pulse signals, which are uniformly spaced in phase, generated by a signal generator in FIG. 4. Referring to FIG. 9, waveforms of any two paths of signals are the same (that is, periods and amplitudes are the same), and waveforms of K paths of signals are uniformly arranged, that is, the space are the same. A phase difference between any two adjacent signals is a basic time unit Δ, frequencies of the K paths of signals are all $f_i$, wherein K is an integer greater than 2.

In one implementation of the embodiments of the present disclosure, the frequency synthesizer 200 is configured to generate the pulse signal according to the following formula:

$$T_{TAF}=(1-r)*T_A+r*T_B, \; T_A=I*\Delta, \; T_B=(I+1)*\Delta \quad (1)$$

That is, $T_{TAF}=(1-r)*I*\Delta+r*(I+1)*\Delta=(I+r)*\Delta$, and the control word F=I+r.

$T_{TAF}$ is a period of the pulse signal, $T_A$ is a first frequency signal (or called as a first periodic signal), and $T_B$ is a second frequency signal (or called as a second periodic signal); I is the aforementioned first coefficient, the first coefficient being configured to select from the K paths of reference pulse signals to synthesize frequency signals; and r is the aforementioned second coefficient, wherein the second coefficient is configured to control the probabilities of occurrence of the first frequency signal and the second frequency signal, r being configured to control the probability of occurrence of $T_B$, and 1-r being configured to control the probability of occurrence of $T_A$.

For example, if the control word I is 3 and r is 0.5, two paths of reference pulse signals with a phase difference of 3Δ are selected from the K paths of reference pulse signals in the first period, and then the two path of reference pulse signals are synthesized and $T_A$=3Δ is output. And two paths of reference pulse signals with a phase difference of 4Δ are selected, and then the two path of reference pulse signals are synthesized and $T_B$=4Δ is output, wherein Δ is the phase difference between any two adjacent signals in the K paths of reference pulse signals which are uniformly spaced in phase.

In the embodiments of the present disclosure, each control word is an integer or a fraction, and each control word is split into an integer part and a fractional part, wherein the integer part is taken as the aforementioned first coefficient, and the fractional part is taken as the aforementioned second coefficient, such that synthesis of pulse signals is performed. For example, in a case that the control word is 5.4, the integer part is 5 and the fractional part is 0.4. For another example, in a case that the control word is 6, the integer part is 6 and the fractional part is 0.

Figure 10:
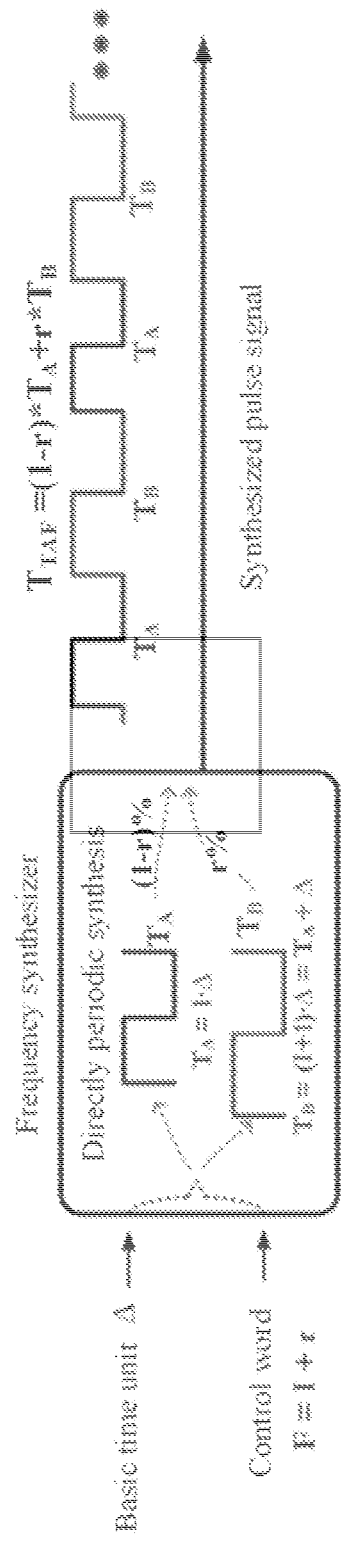
FIG. 10 is a schematic diagram of a principle of pulse signal synthesis by using a frequency synthesizer.

FIG. 10 is a schematic diagram of a principle of a pulse signal synthesis by using a frequency synthesizer. Referring to FIG. 10, the frequency synthesizer performs synthesis to output a pulse signal by using a concept of time-averaged frequency. The following description is given by taking an example of the synthesis of the first frequency signal. The frequency synthesizer receives the control word and the K paths of reference pulse signals which are uniformly spaced in phase. Control word F=I+r, wherein I is the integer part and r is the fractional part; the phase difference between any two adjacent signals in the K paths of reference pulse signals which are uniformly spaced in phase is a basic time unit Δ. The frequency synthesizer first constructs two different clock periods $T_A$ and $T_B$ based on the basic time unit Δ and the integer part I in the control word F, $T_A$=I·Δ, $T_B$=(I+1)·Δ, wherein $T_B$ is larger than $T_A$ in period. The period of $T_B$ being larger than $T_A$ is represented by the length of the high (or low) level of $T_B$ is longer than the length of high (or low) level of $T_A$ in FIG. 10. Then, the frequency synthesizer controls the probabilities of occurrence of $T_A$ and $T_B$, that is, the ratios of the first frequency signal and the second frequency signal as described above, based on the fractional part r in the control word F, thereby generating the pulse signal.

The fractional part of the control word affects the probabilities of occurrence of $T_A$ and $T_B$. In a case that the fractional part is 0.5, the probabilities of occurrence of $T_A$ and $T_B$ are the same. For example, the pulse signal generated is shown in FIG. 10, wherein $T_A$ and $T_B$ occur alternately. In a case that the fractional part is less than 0.5, the probability of occurrence of $T_A$ is greater than the probability of occurrence of $T_B$. The special condition is that when the fractional part is 0, the pulse signal only has one component of $T_A$. In a case that the fractional part is greater than 0.5, the probability of occurrence of $T_B$ is greater than the probability of occurrence of $T_A$.

Figure 11:
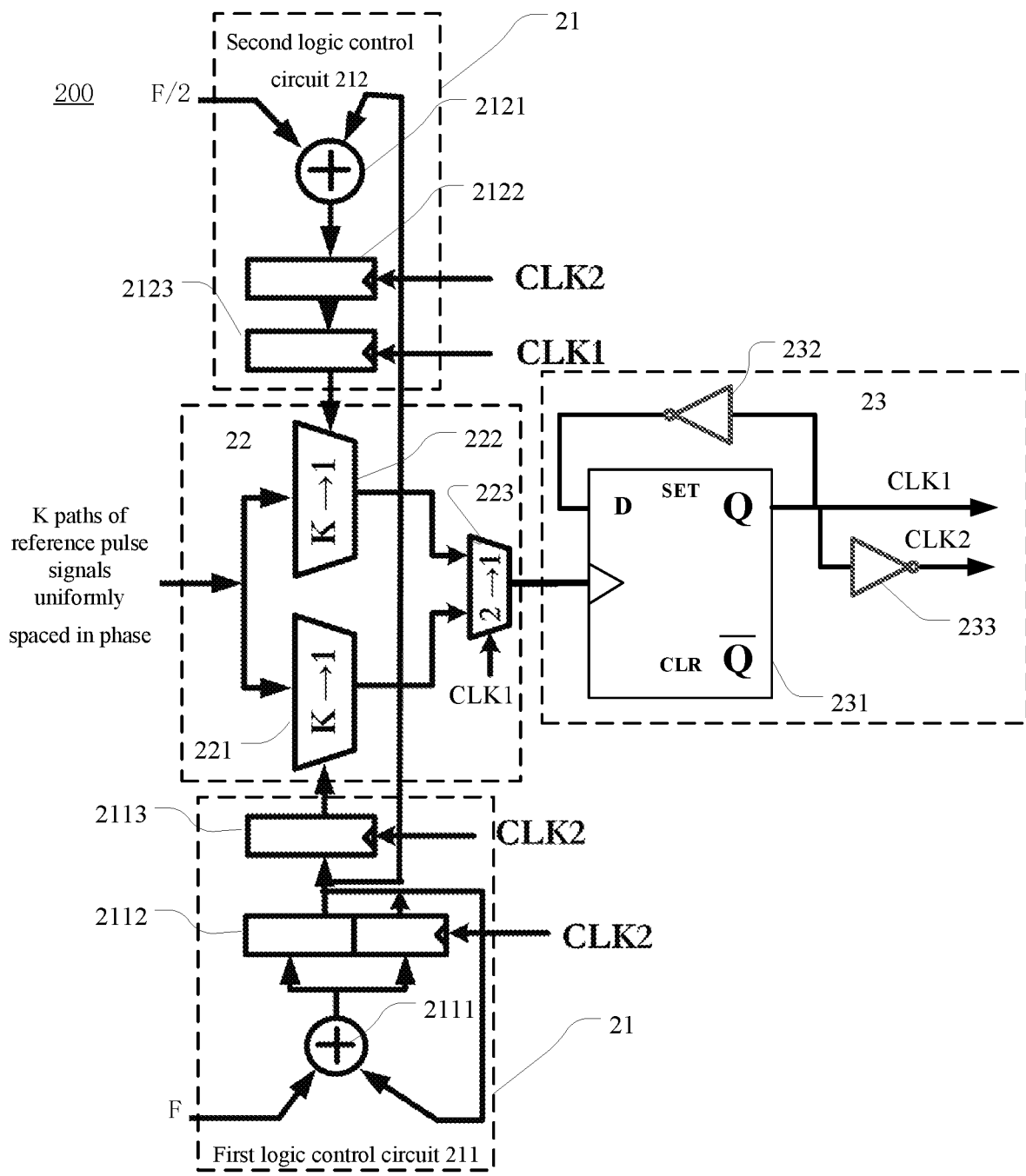
FIG. 11 is a schematic diagram of a structure of a frequency synthesizer according to some embodiments of the present disclosure.

FIG. 11 is a schematic diagram of a structure of a frequency synthesizer according to the present disclosure. Referring to FIG. 11, the frequency synthesizer includes a first processing unit 21, a second processing unit 22 and an output unit 23.

The first processing unit 21 is connected to the controller 30, and the first processing unit 21 is configured to generate a first control signal and a second control signal based on the control word. The second processing unit 22 is connected to the first processing unit 21, and the second processing unit 22 is configured to select a first pulse signal from the reference pulse signals which are uniformly spaced in phase based on the first control signal, select a second pulse signal from the reference pulse signals based on the second control signal, and select one of the first pulse signal and the second pulse signal as an output signal.

The output unit 23 is connected to the second processing unit 22, and the output unit 23 is configured to generate the pulse signal based on the output signal of the second processing unit 22.

The detailed operations of the first processing unit 21, the second processing unit 22, and the output unit 23 are described hereinafter with reference to FIG. 11.

The first processing unit 21 includes a first logic controller 211 and a second logic controller 212.

Referring to FIG. 11, the first logic controller 211 includes a first adder 2111, a first register 2112, and a second register 2113, wherein the first register 2112 is connected to the first adder 2111 and the second register 2113. The first logic controller 211 is configured to generate the first control signal.

The first adder 2111 adds the control word F and the most significant bits (e.g., 5 bits) stored in the first register 2112, and then saves the addition result in the first register 2112 at a rising edge of a second clock frequency CLK2; or alternatively, the first adder 2111 adds the control word F and all bits stored in the first register 2112, and then save the addition result in the first register 2112 at the rising edge of the second clock frequency CLK2. At the next rising edge of the second clock frequency CLK2, the most significant bits stored in the first register 2112 are stored in the second register 2113 as a selection signal of a first K→1 multiplexer 221, that is, the aforementioned first control signal, wherein the first control signal is configured to select one of the K paths of reference pulse signals, which are uniformly spaced in phase, as the first pulse signal.

When the control word F and the most significant bits stored in the first register 2112 are added, in a case that a value in the first register 2112 is less than 1, the most significant bits stored in the second register 2113 are I+1 if the fractional part of the addition result is carried, and the most significant bits stored in the second register 2113 are I if the control word is not carried when added. In the case that the number of the bits stored in the second register 2113 is I+1, the corresponding output of the frequency synthesizer is $T_B=(I+1)\cdot\Delta$. In the case that the number of the bits stored in the second register 2113 is I, the corresponding output of the frequency synthesizer is $T_A=I\cdot\Delta$. It is seen that the output $T_A$ or $T_B$ is related to the size of the fractional part of the control word. The smaller the size of the fractional part of the control word is, the more difficult it is to carry, and the greater the probability of the output $T_A$ is. The larger the size of the fractional part of the control word is, the easier it is to carry, and the greater the probability of the output $T_B$ is.

In some embodiments, the first register 2112 includes a first part storing an integer and a second part storing a fraction. In the addition process, the integer part of the control word F and content in the first part are added, and the fractional part of the control word F and content in the second part are added. The addition process is a binary addition and achieved by an adder.

The second logic controller 212 includes a second adder 2121, a third register 2122 and a fourth register 2123. The third register 2122 is connected to the second adder 2121 and the fourth register 2123. The second logic controller 212 is configured to generate the second control signal.

The second adder 2121 adds half of the control word F/2 to the most significant bits stored in the first register 2112, and then saves the addition result in the third register 2122 at the rising edge of the second clock frequency CLK2. Upon storing the addition result in the third register 2122, at a rising edge of a first clock frequency CLK1, the information stored in the third register 2122 is stored in the fourth register 2123 and the information is taken as a selection signal of a second K→1 multiplexer 222, that is, the aforementioned second control signal. The second control signal is configured to select one of the K multiphase input signals as the second pulse signal. The second clock frequency CLK2 is a signal after the first clock frequency CLK1 passes through NOT gates.

Referring to FIG. 11, the second processing unit 22 includes a first K→1 multiplexer 221, a second K→1 multiplexer 222, and a 2→1 multiplexer 223. The first K→1 multiplexer 221 and the second K→1 multiplexer 222 both include a plurality of input terminals, a control input terminal, and an output terminal. The 2→1 multiplexer 223 includes a control input terminal, an output terminal, a first input terminal, and a second input terminal. The output terminal of the first K→1 multiplexer 221 is connected to the first input terminal of the 2→1 multiplexer 223, and the output terminal of the second K→1 multiplexer 222 is connected to the second input terminal of the 2→1 multiplexer 223; the plurality of the input terminals of the first K→1 multiplexer 221 and the plurality of the input terminals of the second K→1 multiplexer 222 are all connected to a signal generator; and the control input terminal of the first K→1 multiplexer 221 is connected to the second register 2113, and the control input terminal of the second K→1 multiplexer 222 is connected to the fourth register 2123.

The control input terminal of the first K→1 multiplexer 221 selects one of the K paths of reference pulse signals, which are uniformly spaced in phase, as an output signal, that is, the first pulse signal, under the control of the first control signal generated by the first logic controller 211. The control input terminal of the second K→1 multiplexer 222 selects one of the K reference pulse signals, which are uniformly spaced in phase, as an output signal, that is, the second pulse signal, under the control of the second control signal generated by the second logic controller 212.

Taking the first K→1 multiplexer as an example, in the case that the output signal is selected, the value stored in the second register 2113 is selected, that is, the value of the first control signal is selected. For example, in a case that the first control signal is 3, the 3rd path of the K paths of reference pulse signals which are uniformly spaced in phase is selected as the output.

The 2→1 multiplexer 223 selects one of the first pulse signal output from the first K→1 multiplexer 221 and the second pulse signal output from the second K→1 multiplexer 222 as an output signal of the 2→1 multiplexer 223 at the rising edge of the first clock frequency CLK1. For example, the first pulse signal is selected from the start of the first rising edge to the second rising edge, the second pulse signal is selected from the start of the second rising edge to the third rising edge, and the like.

Because the 2→1 multiplexer performs the selection from outputs of the two K→1 multiplexers, the outputs of the two K→1 multiplexers are spliced to form a new period. As the first pulse signals and the second pulse signals of the outputs of the two K→1 multiplexers differ by an integer times of $\Delta$, and two situations that the difference is $I*\Delta$ and the difference is $(I+1)*\Delta$ exist, two different periods of $T_A$ and $T_B$ exist in the pulse signal output by the final frequency synthesizer.

Referring to FIG. 11, the output unit 23 includes a flip-flop circuit. The flip-flop circuit is configured to generate a pulse train. The flip-flop circuit includes a D flip-flop 231, a first inverter 232 and a second inverter 233. The D flip-flop 231 includes a data input terminal, a clock input terminal and an output terminal. The first inverter 232 includes an input terminal and an output terminal. The second inverter 233 includes an input terminal and an output terminal. The clock input terminal of the D flip-flop 231 is connected to the 2→1 multiplexer 223, the data input terminal of the D flip-flop 231 is connected to the output terminal of the first inverter 232, and the output terminal of the D flip-flop 231 is connected to the input terminal of the first inverter 232 and the input terminal of the second inverter 233. The output terminal of the D flip-flop 231 or the output terminal of the second inverter 233 is taken as an output terminal of the frequency synthesizer, that is, a terminal for generating the pulse signal, such that the pulse signal output by the frequency synthesizer is the first clock frequency CLK1 or the second clock frequency CLK2 in FIG. 11.

In the embodiments of the present disclosure, the first clock signal and the second clock signal are the first clock frequency CLK1 output by the frequency synthesizer when different control words are input. Alternatively, the first clock signal and the second clock signal are the second clock frequency CLK2 output by the frequency synthesizer when different control words are input.

The clock input terminal of the D flip-flop 231 receives the output from the output terminal of the 2→1 multiplexer 223 and the D flip-flop 231 outputs the first clock frequency CLK1 through the output terminal. The input terminal of the first inverter 232 receives the first clock frequency CLK1 and the first inverter 232 outputs an output signal to the data input terminal of the D flip-flop 231. The input terminal of the second inverter 233 receives the first clock frequency CLK1 and the second inverter 233 outputs the second clock frequency CLK2 through the output terminal.

Figure 12:
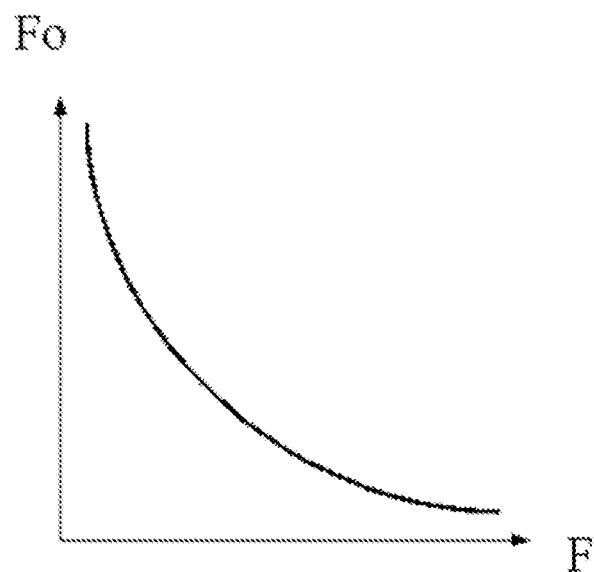
FIG. 12 is a schematic diagram of a relationship between a frequency Fo of a pulse signal and a control word F according to some embodiments of the present disclosure.

The relationship between the frequency Fo of the pulse signal output from the frequency synthesizer and the control word F is Fo=1/(F·Δ) as shown in FIG. 12, and it is seen that when the phase difference Δ is constant, the frequency Fo is inversely proportional to the control word F, that is, the larger the size of the control word, the smaller the frequency.

Referring to FIG. 4, the signal generator 40 is further connected to the controller 30.

The controller 30 is configured to send an initial phase control instruction to the signal generator 40, wherein the initial phase control instruction is configured to control initial phases of the reference pulse signals generated by the signal generator 40, the initial phases of the reference pulse signals being different, and the pulse signals output by the frequency synthesizer being different.

In some embodiments, the circuit of the FIFO memory system according to the embodiments of the present disclosure is integrated in a chip as an Intellectual Property core (IP core) in a large number, thereby reducing power consumption, area, and cost of the FIFO memory in the chip.

Figure 13:
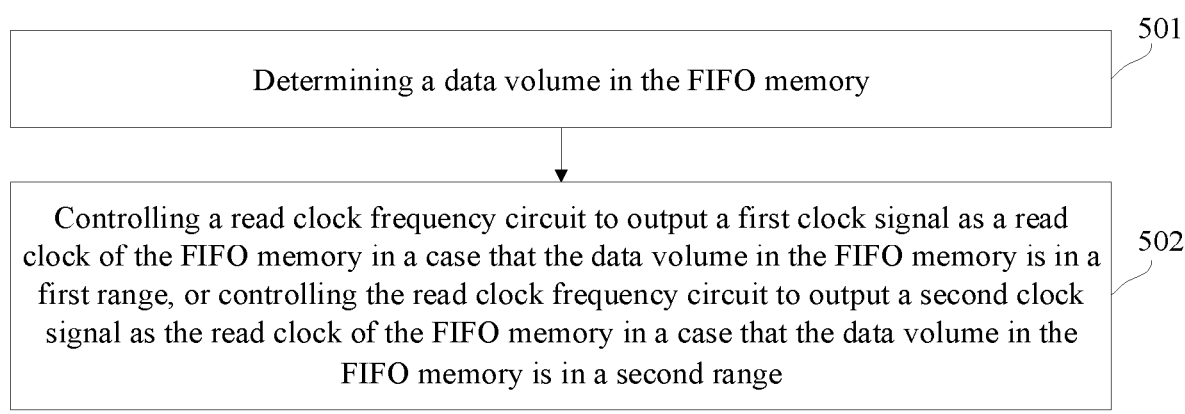
FIG. 13 is a flowchart of a FIFO memory control method according to some embodiments of the present disclosure.

FIG. 13 is a flowchart of a FIFO memory control method according to some embodiments of the present disclosure. Referring to FIG. 13, the FIFO memory control method is performed by the aforementioned FIFO memory system. The method includes following processes.

In 501, a data volume in the FIFO memory is determined.

The process is performed by the controller in FIG. 1.

In some embodiments, the controller is implemented by using a programmable chip or other chips. The controller includes one or more computer-readable storage medium, which are non-transitory. The computer readable-storage medium stores at least one program code. The at least one program code, when loaded and executed by the controller, causes the controller to perform the FIFO memory control method.

In 502, in a case that a data volume in the FIFO memory is in a first range, the read clock frequency circuit is controlled to output a first clock signal as a read clock of the FIFO memory; and in a case that the data volume in the FIFO memory is in a second range, the read clock frequency circuit is controlled to output a second clock signal as a read clock of the FIFO memory.

The process is performed by the controller in FIG. 1.

In some embodiments, a lower limit of the first range is a first threshold, an upper limit of the first range is a capacity of the FIFO memory, a lower limit of the second range is 0, and an upper limit of the second range is a second threshold, the first threshold being greater than the second threshold. The method further includes: in a case that the data volume in the FIFO memory is in a third range, controlling the read clock of the FIFO memory to remain unchanged, wherein a lower limit of the third range is the second threshold, and an upper limit of the third range is the first threshold.

In some embodiments, a ratio of a difference between the first threshold and the second threshold to the capacity of the FIFO memory is not less than 5% and not more than 25%.

In some embodiments, a frequency of the first clock signal is greater than a frequency of a write clock of the FIFO memory, and a frequency of the second clock signal is less than the frequency of the write clock of the FIFO memory.

In some embodiments, wherein controlling the read clock frequency circuit to output the first clock signal as the read clock of the FIFO memory in the case that the data volume in the FIFO memory is in the first range, or controlling the read clock frequency circuit to output the second clock signal as the read clock of the FIFO memory in the case that the data volume in the FIFO memory is in the second range includes: generating a control word based on the data volume in the FIFO memory; and making the read clock frequency circuit output the first clock signal or the second clock signal based on the control word by outputting the control word to the read clock frequency circuit, wherein the first clock signal and the second clock signal both include a first frequency signal and a second frequency signal, probabilities of occurrence of the first frequency signal and the second frequency signal being controlled by the control word.

In some embodiments, wherein generating the control word based on the data volume in the FIFO memory includes: generating a first control word in a case that the data volume in the FIFO memory is in the first range, wherein the first control word is configured to output the first clock signal; generating a second control word in a case that the data volume in the FIFO memory is in the second range, wherein the second control word is configured to output the second clock signal.

In some embodiments, wherein generating the second control word in the case that the data volume in the FIFO memory is in the second range, includes: in a case that the data volume in the FIFO memory is in the second range and a valid signal of the FIFO memory is at a low level, making a frequency of the second clock signal decrease according to a first law by controlling the generated control word to vary. That is, the second control word is variable in the embodiments of the present disclosure.

In the embodiments of the present disclosure, the size of the control word is inversely proportional to the frequency of the second clock signal. That is, the frequency of the second clock signal is controlled to gradually decrease by gradually increasing the output control word.

In some embodiments, the read clock frequency circuit generates a pulse signal based on reference pulse signals which are uniformly spaced in phase and the control word upon receiving the control word, wherein the pulse signal is the first clock signal or the second clock signal.

The control word includes a first coefficient and a second coefficient.

The pulse signal includes the first frequency signal and a second frequency signal, wherein the first frequency signal is generated based on the reference pulse signals and the first coefficient, and the second frequency signal is generated based on the reference pulse signals and the first coefficient, proportion of the first frequency signal and the second frequency signal in the pulse signal being controlled by the second coefficient.

In some embodiments, wherein determining the data volume in the FIFO memory includes: determining the data volume in the FIFO memory based on a flag bit output by the FIFO memory.

Described above are merely exemplary embodiments of the present disclosure and are not intended to limit the present disclosure. Any modifications, equivalents, improvements, and the like made within the spirit and principle of the present disclosure are included in the protection scope defined by appended claims of the present disclosure.

What is claimed is:

1. A first-in, first-out (FIFO) memory system, the FIFO memory system comprising:
a FIFO memory;
a read clock frequency circuit, configured to provide at least two clock signals, wherein the at least two clock signals comprise a first clock signal and a second clock signal, a frequency of the first clock signal being greater than a frequency of the second clock signal; and
a controller, configured to determine a data volume in the FIFO memory, control the read clock frequency circuit to output the first clock signal in a case that the data volume in the FIFO memory is in a first range, or control the read clock frequency circuit to output the second clock signal in a case that the data volume in the FIFO memory is in a second range;
wherein a lower limit of the first range is not less than an upper limit of the second range,
wherein the controller is configured to generate a control word based on the data volume in the FIFO memory; and
the read clock frequency circuit is configured to output the first clock signal or the second clock signal based on the control word; wherein the first clock signal and the second clock signal both comprise a first frequency signal and a second frequency signal, probabilities of occurrence of the first frequency signal and the second frequency signal being controlled by the control word,
wherein the read clock frequency circuit comprises:
a frequency synthesizer, configured to generate a pulse signal based on reference pulse signals and the control word, the reference pulse signals being uniformly spaced in phase, the pulse signal being the first clock signal or the second clock signal;
wherein the control word comprises a first coefficient and a second coefficient; and
the pulse signal comprises the first frequency signal generated based on the reference pulse signals and the first coefficient, and the second frequency signal generated based on the reference pulse signals and the first coefficient, a proportion of the first frequency signal and the second frequency signal in the pulse signal being controlled by the second coefficient.

2. The FIFO memory system according to claim 1, wherein the lower limit of the first range is a first threshold, an upper limit of the first range is a capacity of the FIFO memory, a lower limit of the second range is 0, and the upper limit of the second range is a second threshold, the first threshold being greater than the second threshold; and
the controller is further configured to control the clock signal output by the read clock frequency circuit to remain unchanged in a case that the data volume in the FIFO memory is in a third range, wherein a lower limit of the third range is the second threshold, and an upper limit of the third range is the first threshold.

3. The FIFO memory system according to claim 2, wherein a ratio of a difference between the first threshold and the second threshold to the capacity of the FIFO memory is not less than 5% and not greater than 25%.

4. The FIFO memory system according to claim 3, wherein the frequency of the first clock signal is greater than a frequency of a write clock of the FIFO memory, and the frequency of the second clock signal is less than the frequency of the write clock of the FIFO memory.

5. The FIFO memory system according to claim 1, wherein the controller is configured to, in a case that the data volume in the FIFO memory is in the second range and a valid signal of the FIFO memory is at a low level, make a frequency of the second clock signal decrease according to a first law by controlling the generated control word to vary.

6. The FIFO memory system according to claim 1, wherein the controller is configured to determine the data volume in the FIFO memory based on a flag bit output by the FIFO memory.

7. A FIFO memory control method, the method comprising:
determining a data volume in a FIFO memory; and
controlling a read clock frequency circuit to output a first clock signal as a read clock of the FIFO memory in a case that the data volume in the FIFO memory is in a first range, or controlling the read clock frequency circuit to output a second clock signal as the read clock of the FIFO memory in a case that the data volume in the FIFO memory is in a second range;
wherein a lower limit of the first range is not less than an upper limit of the second range,
wherein controlling the read clock frequency circuit to output the first clock signal as the read clock of the FIFO memory in the case that the data volume in the FIFO memory is in the first range, or controlling the read clock frequency circuit to output the second clock signal as the read clock of the FIFO memory in the case that the data volume in the FIFO memory is in the second range, comprises:
generating a control word based on the data volume in the FIFO memory; and
making the read clock frequency circuit output the first clock signal or the second clock signal based on the control word by outputting the control word to the read clock frequency circuit, wherein the first clock signal and the second clock signal both comprise a first frequency signal and a second frequency signal, probabilities of occurrence of the first frequency signal and the second frequency signal being controlled by the control word,
wherein the read clock frequency circuit comprises:
a frequency synthesizer, configured to generate a pulse signal based on reference pulse signals and the control word, the reference pulse signals being uniformly spaced in phase, the pulse signal being the first clock signal or the second clock signal;
wherein the control word comprises a first coefficient and a second coefficient; and
the pulse signal comprises the first frequency signal generated based on the reference pulse signals and the first coefficient, and the second frequency signal generated based on the reference pulse signals and the first coefficient, a proportion of the first frequency signal and the second frequency signal in the pulse signal being controlled by the second coefficient.

8. The method according to claim 7, wherein the lower limit of the first range is a first threshold, an upper limit of the first range is a capacity of the FIFO memory, a lower limit of the second range is 0, and the upper limit of the second range is a second threshold, the first threshold being greater than the second threshold; and the method further comprises:

controlling the read clock of the FIFO memory to remain unchanged, in a case that the data volume in the FIFO memory is in a third range, wherein a lower limit of the third range is the second threshold, and an upper limit of the third range is the first threshold.

9. The method according to claim 7, wherein generating the control word based on the data volume in the FIFO memory comprises:

in a case that the data volume in the FIFO memory is in a second range and a valid signal of the FIFO memory is at a low level, making a frequency of the second clock signal decrease according to a first law by controlling the generated control word to vary.

10. The method according to claim 7, wherein determining the data volume in the FIFO memory comprises:

determining the data volume in the FIFO memory based on a flag bit output by the FIFO memory.

11. The method according to claim 8, wherein a ratio of a difference between the first threshold and the second threshold to the capacity of the FIFO memory is not less than 5% and not greater than 25%.

12. The method according to claim 11, wherein the frequency of the first clock signal is greater than a frequency of a write clock of the FIFO memory, and the frequency of the second clock signal is less than the frequency of the write clock of the FIFO memory.

13. The method according to claim 8, wherein controlling the read clock frequency circuit to output the first clock signal as the read clock of the FIFO memory in the case that the data volume in the FIFO memory is in the first range, or controlling the read clock frequency circuit to output the second clock signal as the read clock of the FIFO memory in the case that the data volume in the FIFO memory is in the second range, comprises:

generating a control word based on the data volume in the FIFO memory; and making the read clock frequency circuit output the first clock signal or the second clock signal based on the control word by outputting the control word to the read clock frequency circuit, wherein the first clock signal and the second clock signal both comprise a first frequency signal and a second frequency signal, probabilities of occurrence of the first frequency signal and the second frequency signal being controlled by the control word.

14. The method according to claim 8, wherein determining the data volume in the FIFO memory comprises:

determining the data volume in the FIFO memory based on a flag bit output by the FIFO memory.

15. The FIFO memory system according to claim 2, wherein the controller is configured to generate a control word based on the data volume in the FIFO memory; and the read clock frequency circuit is configured to output the first clock signal or the second clock signal based on the control word; wherein the first clock signal and the second clock signal both comprise a first frequency signal and a second frequency signal, probabilities of occurrence of the first frequency signal and the second frequency signal being controlled by the control word.

16. The FIFO memory system according to claim 3, wherein the controller is configured to generate a control word based on the data volume in the FIFO memory; and the read clock frequency circuit is configured to output the first clock signal or the second clock signal based on the control word; wherein the first clock signal and the second clock signal both comprise a first frequency signal and a second frequency signal, probabilities of occurrence of the first frequency signal and the second frequency signal being controlled by the control word.

17. The FIFO memory system according to claim 2, wherein the controller is configured to determine the data volume in the FIFO memory based on a flag bit output by the FIFO memory.

* * * * *